United States Patent
Tsai et al.

(10) Patent No.: US 7,045,376 B2
(45) Date of Patent: May 16, 2006

(54) METHOD OF PASSIVATING SEMICONDUCTOR DEVICE

(75) Inventors: Yaw Ming Tsai, Wurih Township, Taichung County (TW); Shih Chang Chang, Jhudong Township, Hsinchu County (TW); De Hua Deng, Bade (TW); Shih Pin Wang, Pingtung (TW)

(73) Assignee: Toppoly Optoelectronics Corp., (TW)

( * ) Notice: Subject to any disclaimer, the term of this patent is extended or adjusted under 35 U.S.C. 154(b) by 104 days.

(21) Appl. No.: 10/680,295

(22) Filed: Oct. 8, 2003

(65) Prior Publication Data

US 2005/0079688 A1   Apr. 14, 2005

(51) Int. Cl.
*H01L 21/00* (2006.01)
*H01L 21/84* (2006.01)
*H01L 21/8238* (2006.01)

(52) U.S. Cl. ............... 438/38; 438/154; 438/199; 438/958

(58) Field of Classification Search ............... 438/199, 438/38, 958, 149, 30, 154, 913; 257/204, 257/369
See application file for complete search history.

(56) References Cited

U.S. PATENT DOCUMENTS

| | | | |
|---|---|---|---|
| 5,545,289 A * | 8/1996 | Chen et al. ............... 438/694 |
| 6,274,490 B1 | 8/2001 | Chyan et al. | |
| 6,670,289 B1 * | 12/2003 | Lane et al. ............... 438/795 |
| 6,723,665 B1 * | 4/2004 | Tanabe et al. ............ 438/795 |
| 2002/0020840 A1 * | 2/2002 | Nakajima ................. 257/57 |
| 2004/0058560 A1 * | 3/2004 | Ranish et al. ............. 438/795 |

OTHER PUBLICATIONS

S. Wolf and R.N. Tauber, Silicon Processing for the VLSI Era, vol. 1, Lattice Press, 1986, p. 145.*

* cited by examiner

*Primary Examiner*—Carl Whitehead, Jr.
*Assistant Examiner*—Heather Doty

(57) ABSTRACT

A method of passivating a semiconductor device with two types of transistors, e.g., NMOS and PMOS transistors, the semiconductor device is placed in a pressurized sealed chamber and at least two different passivating gases are introduced into the chamber. The two passivating gases can be selected to have one gas suitable for passivating PMOS transistors and the other gas suitable for NMOS transistors.

7 Claims, 3 Drawing Sheets

METHOD OF PASSIVATING SEMICONDUCTOR DEVICE

BACKGROUND OF THE INVENTION

1. Field of the Invention

The present invention relates to a method of passivating a semiconductor device with at least two types of transistors at a high pressure and, more specifically, to a method of conducting a high pressure anneal employing at least two different gases.

2. Description of the Related Art

The use of silicon in semiconductor devices, such as CMOS devices, is well known. The fabrication of CMOS devices typically requires that both n-channel (NMOS) and p-channel (PMOS) transistors are built on the same substrate through numerous steps, which include sputter deposition, photolithography, wet etching, plasma etching, chemical vapor deposition, plasma-enhanced chemical vapor deposition, ion implanting, and annealing steps for activating and driving implanted ions. A number of these steps cause defects in the device. For example, plasma etching typically leaves dangling silicon bonds that reduce electron mobility and cause degradation of the device's performance. Ion implanting can also create damage to the silicon crystal structure.

Recently, a high pressure anneal process was developed to alleviate the problems caused by such dangling bonds. During the high pressure anneal process, the semiconductor devices are typically subjected to a high pressure gas such as hydrogen or ammonia. It is thought that the defects of semiconductor devices are removed when the hydrogen bonds with the broken bonds of silicon. However, since the drains and sources of NMOS and PMOS are doped with different types of impurities which are expected to have different reaction mechanisms during the high pressure anneal process, it is a rather difficult task to optimize process parameters in the high pressure anneal process for a CMOS device. Furthermore, it is rather difficult to choose an annealing gas suitable for both NMOS and PMOS transistors.

SUMMARY OF THE INVENTION

It is an object of the present invention to provide an improved method of passivating a semiconductor device that overcomes the above-mentioned problems of the prior art.

To achieve the above listed and other objects, a semiconductor device with two different types of transistors, e.g., PMOS and NMOS transistors, is placed in a pressurized sealed chamber and at least two different passivating gases are introduced into the chamber. Since the two passivating gases can be selected to have one gas suitable for passivating PMOS transistor and the other gas suitable for NMOS transistor, the method of the present invention can achieve a better result for both the NMOS and PMOS transistors.

The two different passivating gases can be introduced into the chamber simultaneously. Alternatively, the gas suitable for passivating the first type of transistors can be introduced into the chamber first. After the semiconductor device is heated to a temperature for a period sufficient to passivate the first type of transistors, the gas suitable for passivating the second type of transistors is introduced into the chamber maintained at the high pressure and the semiconductor device is heated to a temperature for a period sufficient to passivate the second type of transistors.

Therefore, the separating passivation optimization of the NMOS and PMOS transistors provided in a semiconductor device is achieved by two independent steps as described above such that the process parameters can be optimized to obtain the NMOS and PMOS transistors with desired device characteristics, respectively.

Although the efficiency of passivating operations improves by increasing the passivating pressure above 1 atmosphere, optimum passivating pressures are deemed to be in the 5 to 20 atmosphere range. The semiconductor device can be further processed to form a CMOS device, a BiCMOS device, a DRAM device or a FLASH device or other type of integrated circuit including at least two types of transistors.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
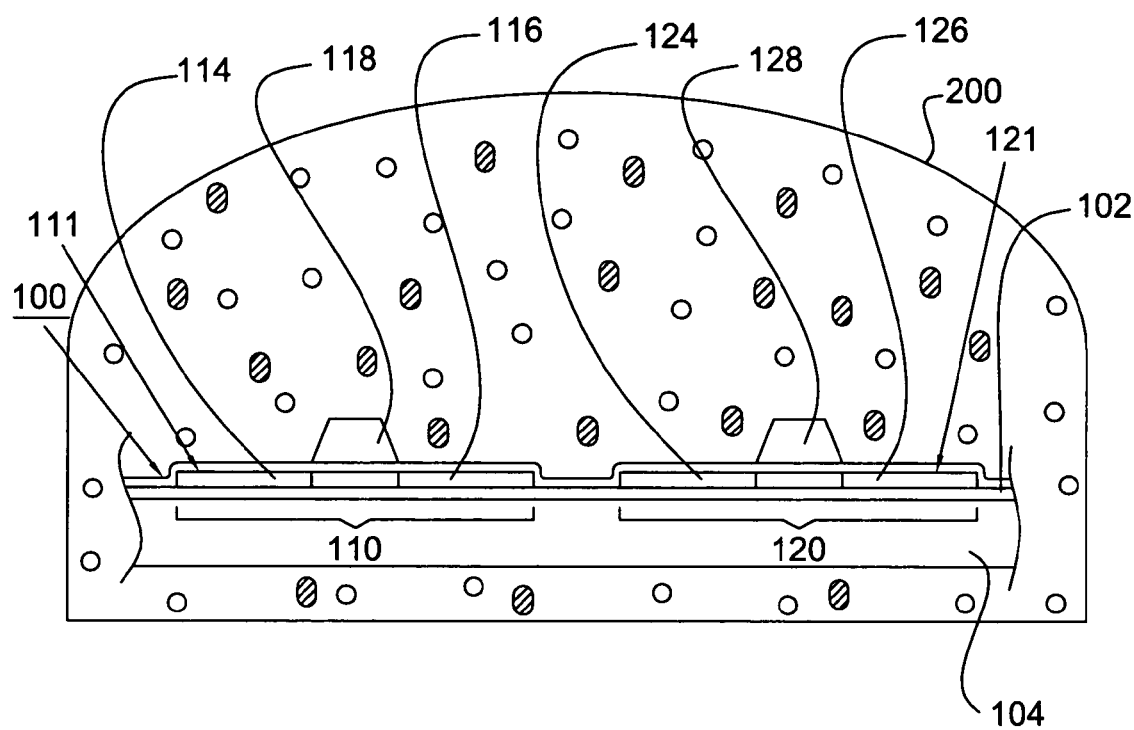
FIG. 1 is a cross-sectional view of a semiconductor device placed in a chamber that is subject to a passivation process according to one embodiment of the present invention.

Referring FIG. 1, there is a cross-sectional view of a semiconductor device 100 that can be passivated according to the principles of the present invention. The semiconductor device 100 has PMOS transistors 110 and NMOS transistors 120. The semiconductor device 100 can be further processed to form a CMOS device, a BiCMOS device, a Bipolar device, a DRAM device or other type of integrated circuit including at least two types of transistors.

As shown in FIG. 1, the semiconductor device 100 includes a buffer layer 102 such as a silicon oxide layer formed on a substrate 104 such as a glass substrate, two semiconductor patterns 111, 121 (typically formed from a poly-crystalline Si thin film) on the buffer layer 102, a gate-insulating film (such as a silicon oxide layer) formed on the semiconductor patterns 111, 121, and two gate electrodes 118, 128. Source 114 and drain 116 of the PMOS transistors 110 are formed by implanting a P-type dopant into the semiconductor pattern 111 with the gate electrode 118 as a mask. Source 124 and drain 126 of the NMOS transistors 120 are formed by implanting a N-type dopant into the semiconductor pattern 121 with the gate electrode 128 as a mask.

In the present invention, the fabrication-induced defects such as dangling bonds or poly-silicon grain boundary (unsaturated silicon bonds) within the semiconductor device 100 are repaired by subjecting the semiconductor device 100 to a passivation process with at least two different passivating gases. The suitable passivating gases in the present invention are $N_2$, $H_2$, $H_2O$, $N_2O$, $O_2$, $NH_3$ and a mixture thereof.

According to one embodiment of the present invention, after the semiconductor device 100 is placed in a chamber 200, two different passivating gases, e.g., $H_2O/N_2$ or $H_2O/H_2$, are introduced into the chamber under a high pressure simultaneously (see FIG. 1). For example, one embodiment has the passivation process taking place at a pressure greater than 1 atmosphere. However, in a preferred embodiment the passivation process occurs at a pressure between 5 atmospheres and 20 atmospheres. In one embodiment, the passivation process is conducted at an annealing temperature of less than about 600° C. One having skill in the art knows that the aforementioned process parameters can be combined to produce the most optimum conditions for the passivation process of the present invention. It is believed that the passivating gases $H_2O/N_2$ or $H_2O/H_2$ not only provide hydrogen atoms which bond with the broken bonds of silicon, but also diffuse into the poly-crystalline Si thin film to passivate the poly-Si grain boundaries thereby overall providing a more robust device.

Note that since the two passivating gases can be selected to have one gas suitable for passivating the PMOS transistors 110, and the other gas suitable for the NMOS transistors 120, the method of the present invention can achieve a better result for both the NMOS and PMOS transistors. In one embodiment of the present invention, the mobility of the passivated semiconductor device 100 could achieve at least 150 cm$^2$/V-s.

Figure 2:
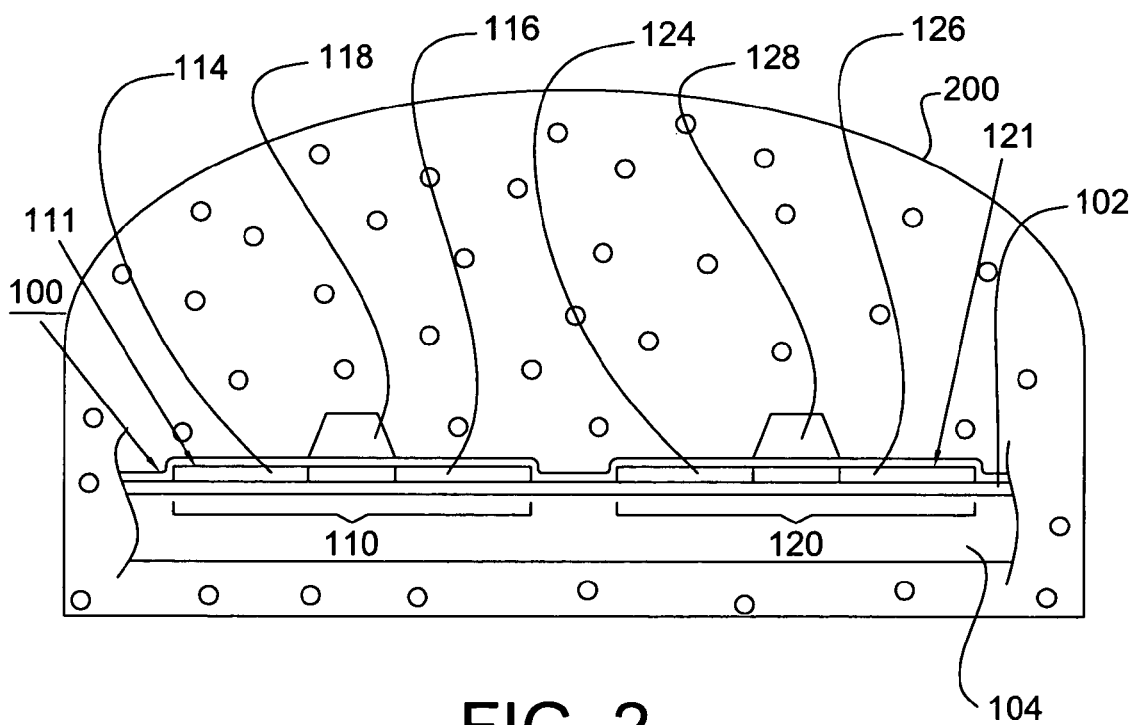
FIGS. 2–4 illustrate, in cross-sectional view, the major steps of a passivation process according to another embodiment of the present invention.
Figure 3:
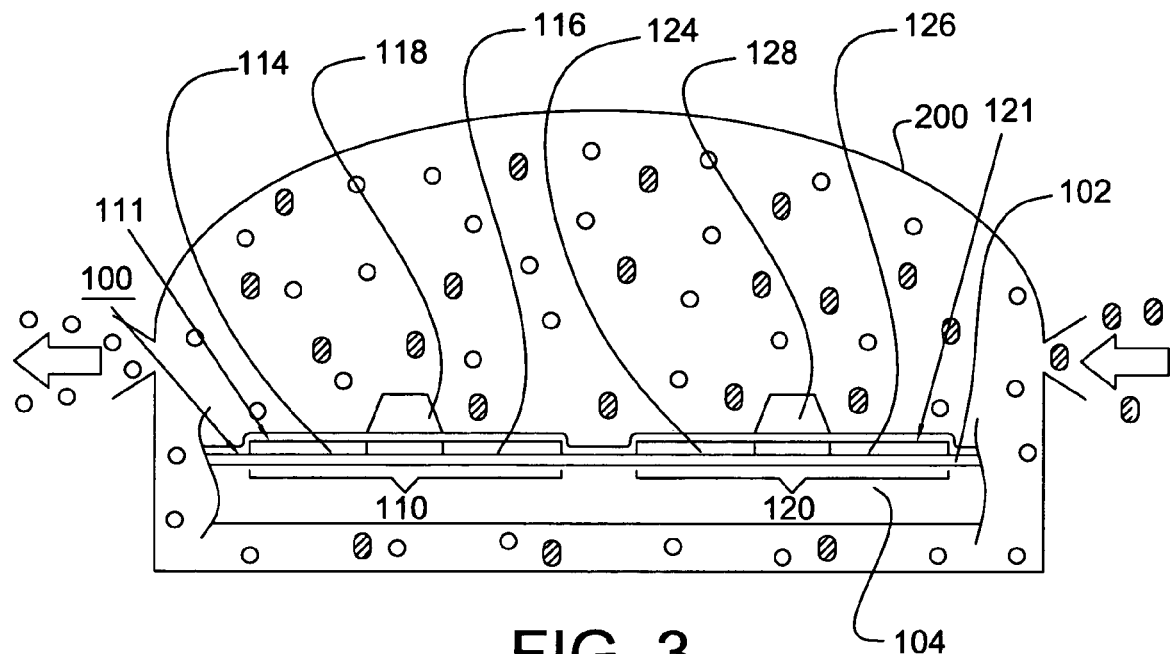
Figure 4:
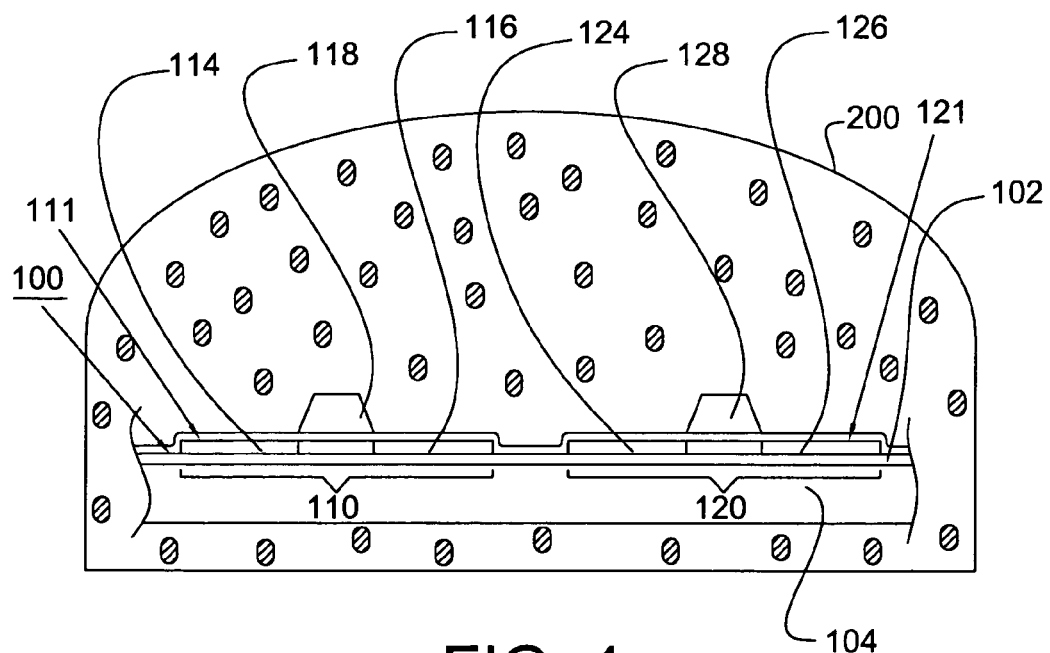

According to another embodiment of the present invention, the passivation process is separated into two independent steps. The first step: a first passivating gas suitable for passivating the PMOS transistors 110 (e.g., $H_2$ or $N_2$) is introduced into a chamber 200 under a high pressure (see FIG. 2) and then a semiconductor device 100 is heated to a temperature for a period sufficient to passivate the PMOS transistors 110. The second Step, a second gas suitable for passivating the NMOS transistors 120 (e.g., $H_2O$ or $NH_3$) is introduced into the chamber 200 maintained at a high pressure (see FIG. 3) and then the semiconductor device 100 is heated to a temperature for a period sufficient to passivate the NMOS transistors 120. Alternatively, the first passivating gas can be drained out of the chamber 200 by introducing the second passivating gas into the chamber 200 such that the NMOS transistor 120 is passivated with only the second passivating gas (see FIG. 4). Since the passivation of the PMOS and NMOS transistors 110, 120 is conducted in an independent manner as described above, the process parameters can be optimized for the NMOS transistors 120 and PMOS transistors 110 respectively. The PMOS transistors 110 and the NMOS transistors have substantially uniform threshold voltage and the threshold voltage difference between PMOS transistors 110 and NMOS transistors 120 was kept at most two volts.

Figure 5:
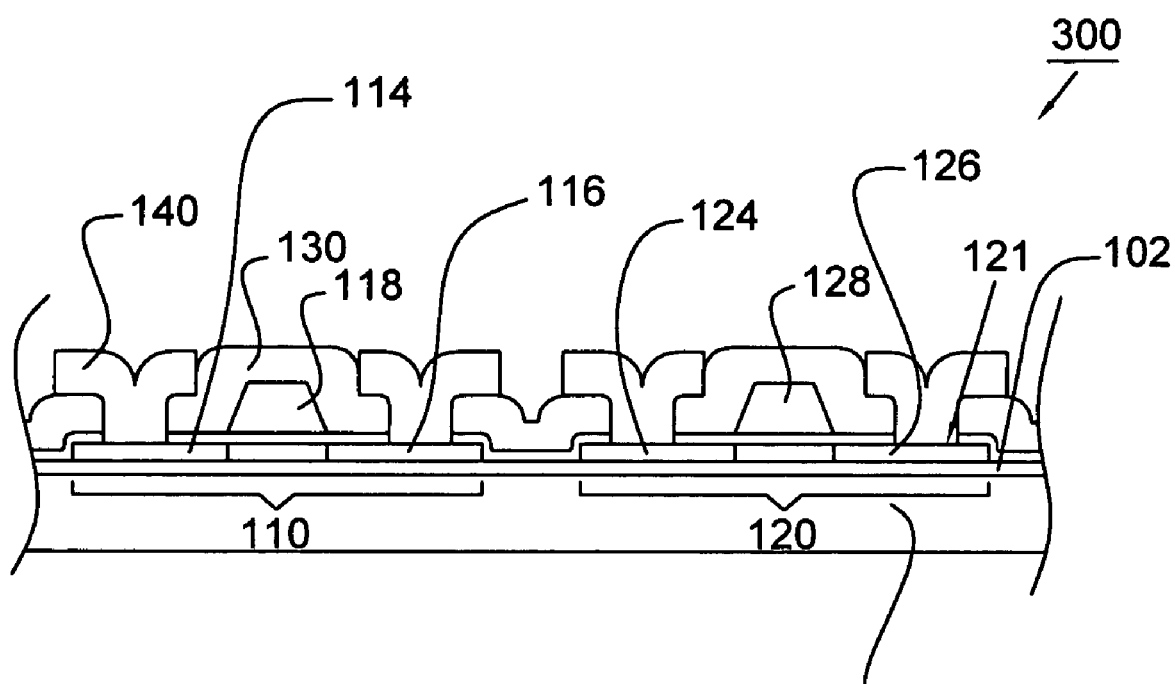
FIG. 5 is a cross-sectional view of a CMOS circuit formed from the semiconductor device shown in FIG. 1.

After the semiconductor device 100 is passivated according to the principles of the present invention, the semiconductor device 100 can further processed to a CMOS circuit 300 (see FIG. 5) of an active matrix display device. Specifically, a passivation layer 130 (e.g., SiNx layer) is formed on the entire surface of the semiconductor device 100 and the passivation layer 130 is patterned to expose parts of the source/drain 114, 116 and the source/drain 124, 126. A metal film is patterned to form the interconnect structures 140 connecting the PMOS and NMOS transistors to other areas of the CMOS circuit 300.

It should be understood that the passivation process of the present invention can be conducted after the passivation layer 130 is formed. Although the present invention is discussed in detail with respect to a CMOS circuit of an active matrix display device, the present invention is applicable to a wide variety of semiconductor devices having two different types of transistors.

Although the invention has been explained in relation to its preferred embodiment, it is to be understood that many other possible variations can be made without departing from the spirit and scope of the invention as hereinafter claimed.

What is claimed is:

1. A method of passivating a semiconductor device, said method comprising:
   placing a semiconductor device in a chamber, the semiconductor device having a first type of transistors and a second type of transistors;
   introducing a first passivating gas and a second passivating gas into the chamber; and
   heating the semiconductor device to a temperature for a period sufficient to passivate the semiconductor device;
   wherein
   the first passivating gas is introduced into the chamber and the semiconductor device is heated to a temperature for a period sufficient to passivate the first type of transistors, and then the second passivating gas is introduced into the chamber and the semiconductor device is heated to a temperature for a period sufficient to passivate the second type of transistors; and
   the first passivating gas is drained out of the chamber by introducing the second passivating gas into the chamber and the pressure of the chamber is greater than 1 atmosphere.

2. The method as claimed in claim 1, wherein the first passivating gas is $H_2$ or $N_2$.

3. The method as claimed in claim 2, wherein the second passivating gas is $H_2O$ or $NH_3$.

4. The method as claimed in claim 1, wherein the first type of transistors are PMOS transistors and the second type of transistors are NMOS transistors.

5. The method as claimed in claim 1, wherein the semiconductor device comprises a CMOS circuit of an active matrix display device.

6. The method as claimed in claim 1, wherein the chamber maintains a pressure between 5 atmospheres and 20 atmospheres.

7. The method as claimed in claim 1, wherein the first type of transistors are PMOS transistors and the first passivating gas is $H_2$ or $N_2$, and the second type of transistors are NMOS transistors and the second passivating gas is $H_2O$ or $NH_3$.

* * * * *